United States Patent
Zhang et al.

(10) Patent No.: US 11,639,956 B2
(45) Date of Patent: May 2, 2023

(54) INTEGRATED CIRCUIT TESTING APPARATUS AND METHOD

(71) Applicant: UI Green Micro & Nano Technologies Co Ltd, Suzhou (CH)

(72) Inventors: Mark Zhang, Suzhou (CH); Arvin Guo, Suzhou (CH); Jeff Tamasi, Overland Park, KS (US); Steve Liu, Suzhou (CH)

(73) Assignee: UI Green Micro & Nano Technologies Co Ltd, Suzhou (CN)

( * ) Notice: Subject to any disclaimer, the term of this patent is extended or adjusted under 35 U.S.C. 154(b) by 0 days.

(21) Appl. No.: 17/467,580

(22) Filed: Sep. 7, 2021

(65) Prior Publication Data

US 2021/0396802 A1    Dec. 23, 2021

Related U.S. Application Data

(62) Division of application No. 16/795,316, filed on Feb. 19, 2020, now Pat. No. 11,143,699.

(51) Int. Cl.
*G01R 31/28* (2006.01)

(52) U.S. Cl.
CPC ..... *G01R 31/2863* (2013.01); *G01R 31/2886* (2013.01)

(58) Field of Classification Search
CPC .......... G01R 1/067; G01R 1/06716; G01R 1/06722; G01R 1/07307; G01R 1/07314

See application file for complete search history.

(56) References Cited

U.S. PATENT DOCUMENTS

| | | | |
|---|---|---|---|
| 2005/0275398 A1* | 12/2005 | Yamashita | G01R 31/2891 324/750.03 |
| 2008/0088331 A1* | 4/2008 | Yoshida | G01R 1/0466 324/755.05 |
| 2009/0042415 A1* | 2/2009 | Nakamura | G01R 1/0466 439/70 |

* cited by examiner

*Primary Examiner* — Tung X Nguyen
(74) *Attorney, Agent, or Firm* — Blake E. Vande Garde; Avek IP, LLC

(57) ABSTRACT

A test socket comprising a guide plate with a lower surface engaged with an upper surface of a main test structure, the guide plate further including an upper surface which is parallel to the lower surface and an opening extending through the guide plate, the main test structure includes a body with one or more apertures through the upper surface and one or more probes mounted within the main test structure, the probes including a front end which extends through the apertures for engagement by a lead or terminal pad of a device to be tested, and a tail end which is secured within the main test structure by an elastomeric material.

16 Claims, 3 Drawing Sheets

INTEGRATED CIRCUIT TESTING APPARATUS AND METHOD

RELATED CASES

This is a divisional application of U.S. patent application Ser. No. 16/795,316 filed on Feb. 19, 2020. The disclosure of that application is expressly incorporated by reference.

FIELD OF INVENTION

The present invention pertains generally to test sockets with high frequency test capability and more specifically to a test socket with high current carrying capacity which is suitable for chip.

BACKGROUND OF THE INVENTION

Manufacturers test integrated circuit devices to ensure that consumers receive devices of the highest quality. Manufacturers utilize a plurality of test apparatus to carry out the testing. A tester generally includes a printed circuit board which includes multiple conductive traces. Each trace is associated with a corresponding function of the test apparatus.

A lead, in the case of a leaded device being tested, or a pad, in the case of a nonleaded device being tested, is interconnected to a corresponding trace on the load board. A test set or test socket is used between the device being tested and the load board in order to achieve interconnection. One end of each probe is engaged by either the lead or terminal pad of the device being tested, and the opposite end of the probe engages the trace on the load board.

As technology has evolved, the shape, size and electrical properties of probes have evolved by necessity in response to the construction of test sets and load boards and the design of devices to be tested. Signal strength is also a vital consideration when designing a testing device. Maintaining impedance through a conducting portion of a probe interconnecting the integrated circuit lead or terminal pad to its corresponding load board pad at a particular desired level is also desirable. The impedance that is achieved is a function of a number of factors. These include width and length of conduction path, material of which the conductive structure is made, material thickness, etc.

The present invention includes a probe which improves the testing function beyond what is achieved with other probes. It takes into consideration the dictates of the prior art and overcomes problems extant therein. Thus, there is clearly a need for an integrated circuit testing apparatus which addresses these issues.

SUMMARY OF THE INVENTION

A test socket comprising a guide plate with a lower surface engaged with an upper surface of a main test structure, the guide plate further including an upper surface which is parallel to the lower surface and an opening extending through the guide plate, the main test structure includes a body with one or more apertures through the upper surface and one or more probes mounted within the main test structure, the probes including a front end which extends through the apertures for engagement by a lead or terminal pad of a device to be tested, and a tail end which is secured within the main test structure by an elastomeric material.

DESCRIPTION OF THE DRAWINGS

For the purpose of illustrating the invention, there is shown in the drawings a form that is presently preferred; it being understood, however, that this invention is not limited to the precise arrangements and instrumentalities shown.

DETAILED DESCRIPTION

Figure 1:
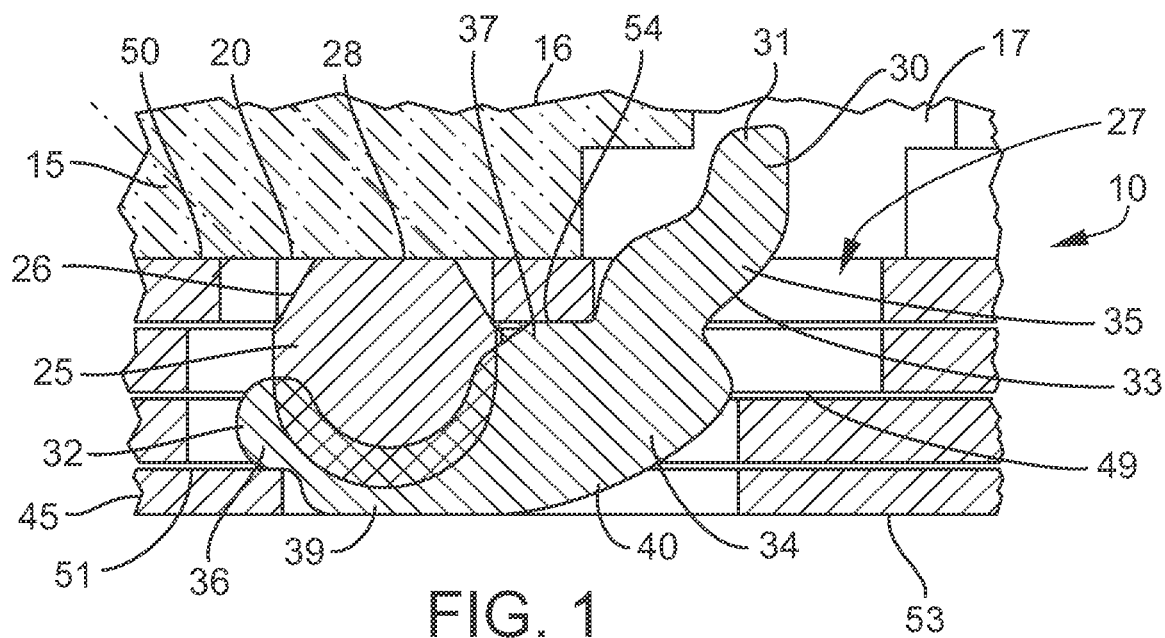
FIG. 1 is a side elevation view of one embodiment of an integrated circuit testing apparatus.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

The instant invention is an improved integrated circuit testing apparatus and method of using that apparatus. The instant invention includes a test socket 10 comprising a guide plate 15 with a lower surface 20 engaged with an upper surface 50 of a main test structure 45, the guide plate 15 further including an upper surface 16, which is parallel to the lower surface 20, and an opening 19 extending through the guide plate 15. The main test structure 45 includes a body 47 with one or more apertures 27 through the upper surface 50 and one or more probes 30 mounted within the main test structure 45. The probes 30 include a front end 31 which extends through the apertures 27 for engagement by a lead 64 or terminal pad of a device 60 to be tested, and a tail end 32 which is secured within the main test structure 45 by an elastomeric material 25.

The instant invention also includes a test socket 10 comprising a guide plate 15 with a lower surface 20 engaged with an upper surface 50 of a main test structure 45, the guide plate 15 further including an upper surface 16, which is parallel to the lower surface 20, and an opening 19 extending through the guide plate 15. The main test structure 45 includes a body 47 with one or more apertures 27 through the upper surface 50 and one or more probes 30 mounted within the main test structure 45. The probes 30 include a front end 31 which extends through the apertures 27 for engagement by a lead 64 or terminal pad of a device 60 to be tested, and a tail end 32 which is secured within the main test structure 45 by an elastomeric material 25. The probes further include a body 34 with the front end 31 emanating from a front extension 35 and the tail end 32 emanating from a tail extension 36. The body 34 includes an arcuate surface 40 which engages a trace within the main test structure 45. The front extension 35 further includes a linear portion 39 which engages a first seat 49 within the main test structure 45 when engaged by the device to be tested 60 and the tail end 32 engages a second seat 51 located proximally to the elastomeric material 25.

Figure 2:
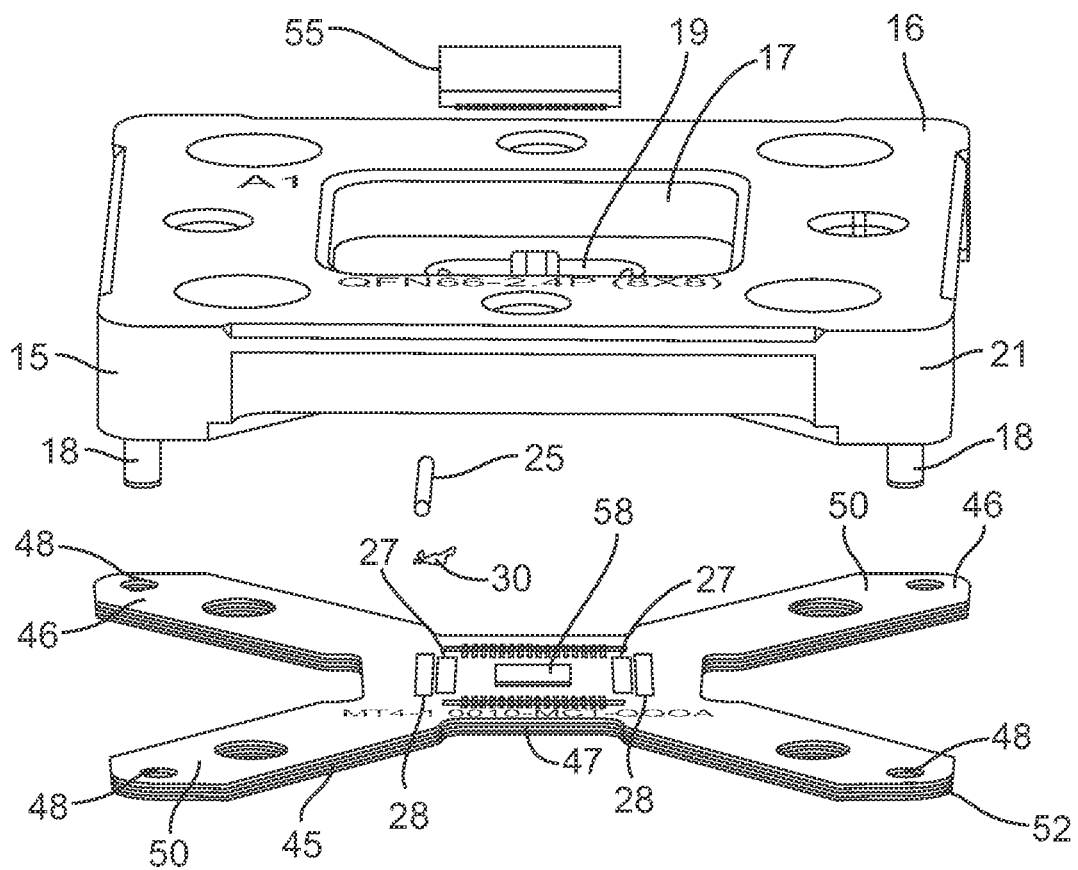
FIG. 2 is an exploded view of one embodiment of an integrated circuit testing apparatus.

Looking more specifically to the figures, there is illustrated the various components of the instant invention. FIGS. 1 and 2 illustrate a test socket 10 which includes a guide plate 15 with an upper surface 16 and a lower surface 20 which is substantially parallel to the upper surface 16 and facing the opposite direction. The guide plate 15 includes a recessed opening 17 located on its upper surface 16. The recessed opening 17 does not extend through the body 21 of the guide plate 15. The guide plate 15 also includes an opening 19 located within the recessed opening which extends through body 21 of the guide plate 15 to the lower surface 20. The guide plate 15 also includes one or more pins 18 which engage with the main test structure 45 when the test socket 10 is assembled. The guide plate 15 is made from any material known in the art. The guide plate 15 can be made from a material selected from the group comprising a polyether block amide (PEBA), a polyether ether ketone (PEEK), polyvinyl alcohol (PVA), Polytetrafluoroethylene (PTFE), fluorinated ethylene propylene (FEP), polyvinyl, polyamide, polyimide, polyethylene, or a combination thereof.

The test socket 10 also comprises a main test structure 45 which includes a body 47 and a plurality of arms 46 which emanate from the body of the main test structure. The body 47 and the arms 46 include an upper surface 50 and a lower surface 53. Each arm 46 includes one or more apertures which may or may not extend through the arm from the upper surface 50 to the lower surface 53. Each arm may include a pin aperture 48 which is engaged by a pin 18 from the guide plate 15 when the text socket 10 is assembled. As shown in the figures, the main test structure 45 is constructed of a plurality of layers 52. The layers 52 define the open chambers within the main test structure 45. Looking to the figures, a pair of apertures 27 and 28 are illustrated. The first aperture 27 is where the front end 31 each probe 30 extends out of a chamber within the main test structure 45. The second aperture 28 is the opening of a channel 26 allows for the insertion and removal of an elastomeric material 25 within the channel 26 which secures the probe(s) 30 in place within the main test structure 45. Each channel 26 runs perpendicular to the orientation of the probes 30 when they are secured within the chamber of the main test structure 45. The main test structure 45 also includes a ground pad 58 which is known in the art. Within the main test structure 45 there is a first seat 49 which limits the degree of downward movement of the probe 30 when the probe is engaged with a device to be tested. There is also a second seat 51 within the main test structure 45. The second seat 51 is engaged by the tail end 32 of the probe 30 and aids in maintaining the position of the probe. A shoulder 54 is also defined within the main test structure 45. Engagement of the shoulder 54 by a protrusion 37 emanating from the body 34 of the probe 30 serves to limit the degree of upward movement of the probe 30 and the distance that the front end 31 of the probe extends beyond the upper surface 50 of the main test structure 45 when the probe 30 is not engaged by a device to be tested. Polyimide films have been the organic dielectric of choice for decades in the microelectronic industry because of the materials' high thermal, chemical, and mechanical stability to temperatures above 300° C. These properties make polyimide films ideal for the material for the main test structure 45.

Figure 3:
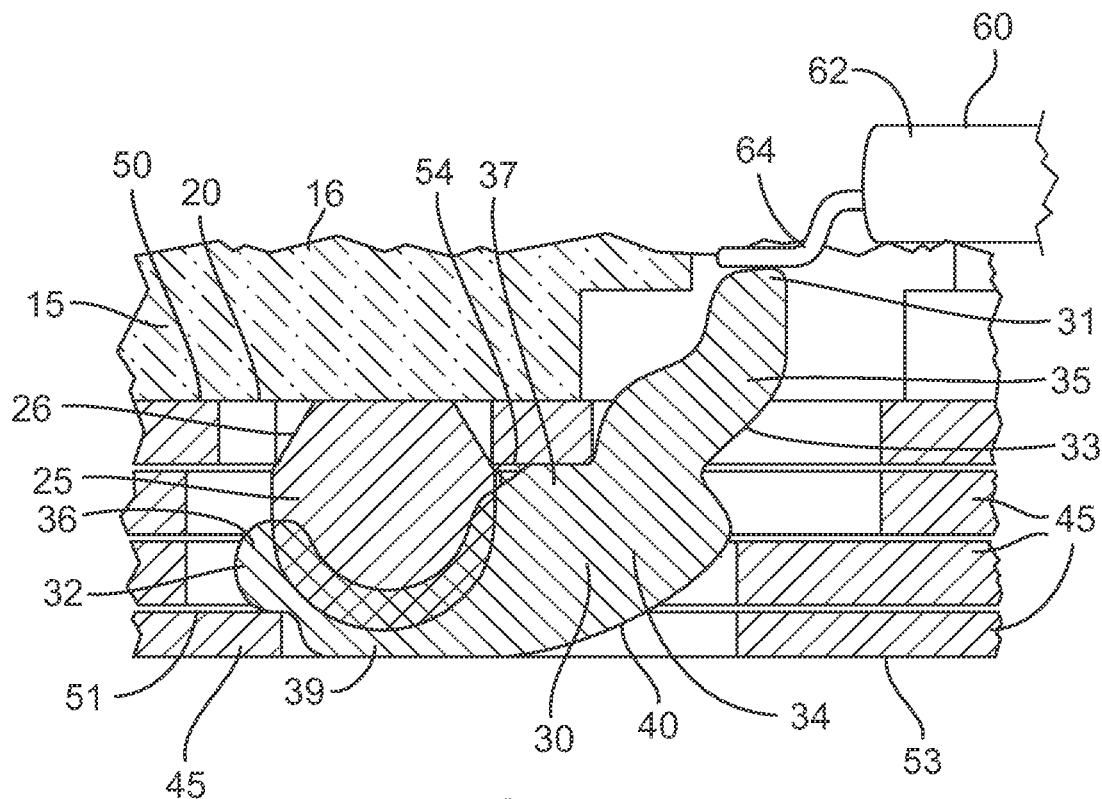
FIG. 3 is a side elevation view of one embodiment of an integrated circuit testing apparatus.
Figure 4:
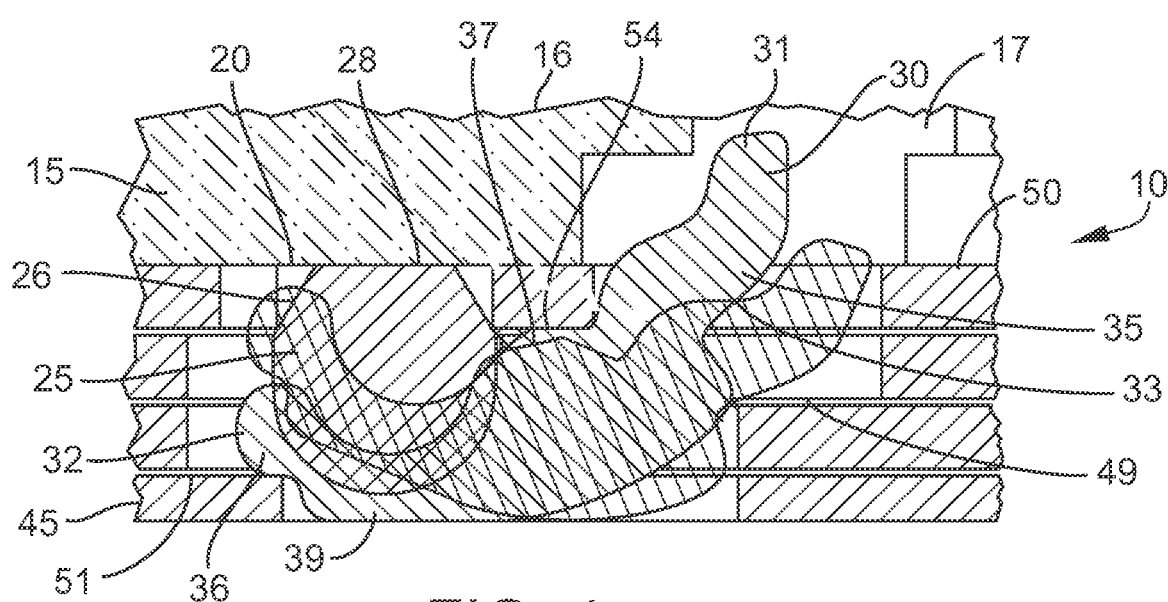
FIG. 4 is a side elevation view of one embodiment of an integrated circuit testing apparatus.
Figure 5:
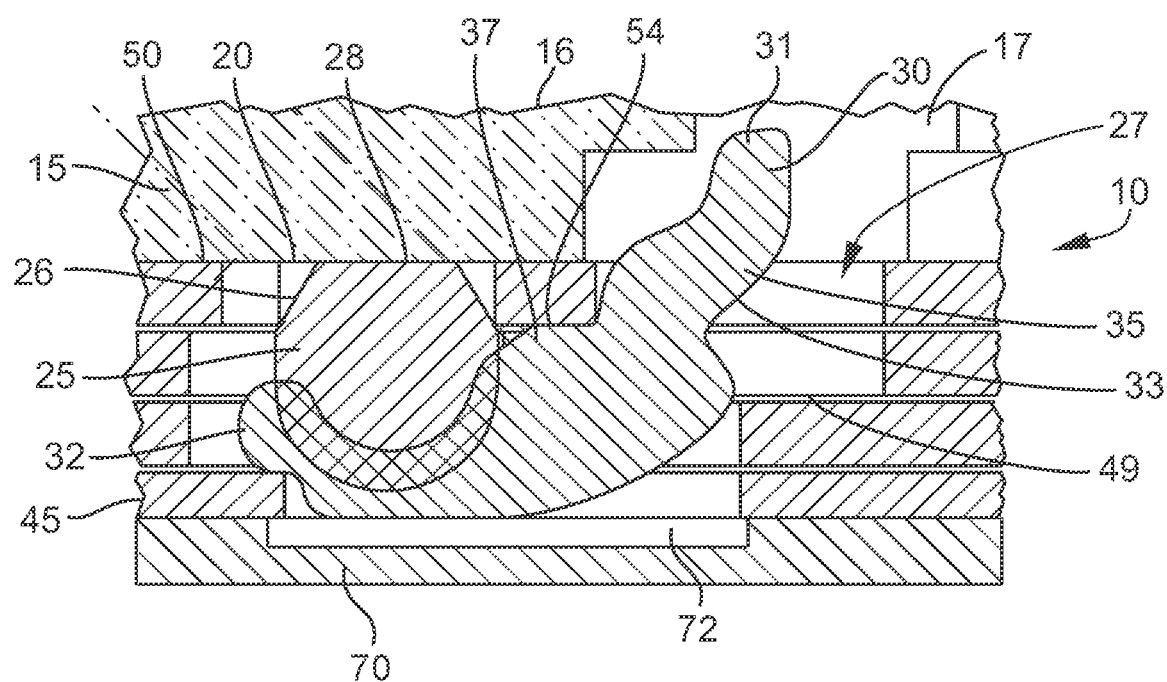
FIG. 5 is a side elevation view of one embodiment of an integrated circuit testing apparatus.

The test socket also includes one or more probes 30 secured within the main test structure 45. The probes can be made from any material known in the art including, but not limited to, metals, precious metals and alloys thereof. Each probe 30 can be a high frequency probe. In a preferred embodiment, each probe is manufactured by stamping to ensure and maintain consistency among the probes. The probes may be manufactured by machining, stamping, or a combination thereof. The probe 30 includes a body 34, a front end 31 emanating from a front extension 35 which is emanating out from the body 34, and a tail end 32 emanating from a tail extension 36 which is also emanating out from the body 34. The tail extension 36 narrows, defining the tail end 32 as rounded as clearly illustrated in FIGS. 1, 3, and 4. The body includes an arcuate surface 40 which will engage the trace formed on the surface of the tester load board. The arcuate surface 40 will roll and maintain contact with the trace as each device is tested. The body also includes a protrusion 37 which engages a shoulder 54 located within main test structure 45 as described previously above. Each probe 30 also includes a linear protrusion 33 which is located on the front extension 35. The linear protrusion 33 engages a first seat 49 which limits the degree of downward movement of the probe 30 when the probe is engaged with a device to be tested.

As stated previously, an elastomeric material 25 is used to secure the probe(s) 30 in place within the main test structure 45. The elastomeric material 25 is generally rod shaped and comprised of a material selected from the group including a thermoplastic elastomer, a thermoplastic urethane, a natural rubber, a synthetic rubber, a silica gel, a polymer, a copolymer, a polyolefin, or a combination thereof. The elastomeric material is inserted into a channel 26 located within the main test structure 45 and accessible through the second aperture 28.

It will be understood that various types of integrated circuit devices 55 are able to be tested utilizing a test socket 10 or test set in accordance with the present invention. The test socket 10 is intended for use with a tester generally employed for determining the quality of integrated circuit devices used in electronics.

The instant invention also includes a test set mounted to a load board 70 or a tester apparatus to electrically connect one or more leads 64 or terminal pads of a device to be tested 60 with a corresponding metallic trace 72 on the load board 70 comprising a test socket 10 including a guide plate 15 with a lower surface 20 engaged with an upper surface 50 of a main test structure 45, the guide plate 15 further including an upper surface 16, which is parallel to the lower surface, and an opening 19 extending through the guide plate, The main test structure 45 includes a body 47 with one or more apertures 27, 28 through the upper surface 50 and a plurality of probes 30 mounted within the main test structure 45, the probes including a front end 31 emanating from a front extension 35 which extends through the apertures 27 for engagement by a lead 64 or terminal pad of a device to be tested 60, and a tail end 32 emanating from a tail extension 36 which is secured within the main test structure 45 by an elastomeric material 25, and the body 34 includes an arcuate 40 surface which engages a trace on the load board or tester apparatus, wherein the front extension 35 further includes a linear portion 39 which engages a first seat 49 within the main test structure 45 when engaged by the device to be tested 60 and wherein the tail end 32 includes a narrowed section and an expanded end which engages a second seat 51 located proximally to the elastomeric material 25 to maintain the probes 30 in a desired position/orientation.

The test set described above may incorporate any design element contained within this application and any other document/application incorporated by reference herein. The test set described above may include a main test structure 45 made from polyimide film, and may include a guide plate made from a material selected from the group comprising: a polyether block amide (PEBA), a polyether ether ketone (PEEK), polyvinyl alcohol (PVA), Polytetrafluoroethylene (PTFE), fluorinated ethylene propylene (FEP), polyvinyl, polyamide, polyimide, polyethylene, or a combination thereof. The test set described above may include an elastomeric material 25 which is rod shaped and comprised of a material selected from the group including a thermoplastic elastomer, a thermoplastic urethane, a natural rubber, a synthetic rubber, a silica gel, a polymer, a copolymer, a polyolefin, or a combination thereof. The test set described above may include precompression of the elastomeric material 25 by the one or more probes 30 and further compression by the probe(s) 30 as the front end 31 of the probe is engaged by the lead or terminal pad of the device to be tested and urged into the aperture. The test set described above may include a shoulder defined by said housing for engaging the probe and limiting the distance the probe extends beyond the upper surface of the main test structure.

The instant invention also includes a method of testing a device using any of the test sockets or test sets described herein. Any method described herein may incorporate any design element contained within this application and any other document/application incorporated by reference herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

The present invention may be embodied in other forms without departing from the spirit and the essential attributes thereof, and, accordingly, reference should be made to the appended claims, rather than to the foregoing specification, as indicating the scope of the invention. The invention illustratively disclosed herein suitably may be practiced in the absence of any element which is not specifically disclosed herein.

The invention claimed is:

1. A test socket comprising:
   a main test structure with a body and an upper surface;
     wherein the main test structure includes one or more apertures through the upper surface;
   a guide plate engaged to the upper surface of the main test structure;
     wherein the guide plate includes an opening extending through a body of the guide plate;
   one or more probes mounted within the main test structure, said probes including:
     a body which engages a trace within the main test structure;
     a front end emanating from the body and extending through said apertures for engagement by a lead or terminal pad of a device to be tested; and
     a tail end emanating from the body which is secured within the main test structure by an elastomeric material;
       wherein the elastomeric material engages only the tail end side of the probe.

2. The test socket of claim 1 wherein the front end further includes a linear portion which engages a first seat within the main test structure when engaged by the device to be tested; and
   wherein the tail end engages a second seat located proximally to the elastomeric material.

3. The test socket of claim 1 wherein the one or more probes being high frequency probes.

4. The test socket of claim 1 wherein the main test structure is made from polyimide film.

5. The test socket of claim 1 wherein the guide plate is made from a material selected from the group comprising: a polyether block amide (PEBA), a polyether ether ketone (PEEK), polyvinyl alcohol (PVA), Polytetrafluoroethylene (PTFE), fluorinated ethylene propylene (FEP), polyvinyl, polyamide, polyimide, polyethylene, or a combination thereof.

6. The test socket of claim 1 wherein the elastomeric material is rod shaped and comprised of a material selected from the group including a thermoplastic elastomer, a thermoplastic urethane, a natural rubber, a synthetic rubber, a silica gel, a polymer, a copolymer, a polyolefin, or a combination thereof.

7. The test socket of claim 1 wherein the elastomeric material is pre-compressed by the one or more probes and compressed further by the probe as the front end of the probe is engaged by the lead or terminal pad of the device to be tested and urged into the aperture.

8. The test socket of claim 1 further comprising a shoulder defined by said housing for engaging the probe and limiting the distance the probe extends beyond the upper surface of the main test structure.

9. A method for testing a device comprising the steps of:
   providing a test socket comprising:
     a main test structure with a body and an upper surface;
       wherein the main test structure includes one or more apertures through the upper surface;

a guide plate engaged to the upper surface of the main test structure;
   wherein the guide plate includes an opening extending through a body of the guide plate;
   one or more probes mounted within the main test structure, said probes including:
      a body which engages a trace within the main test structure;
      a front end emanating from the body and extending through said apertures for engagement by a lead or terminal pad of a device to be tested: and
      a tail end emanating from the body which is secured within the main test structure by an elastomeric material;
      wherein the elastomeric material engages only the tail end side of the probe;
   engaging one or more leads or terminal pads emanating from the device with one or more of the probes within the test socket; and
   verifying the quality of the device based on the information obtained from the test.

10. The method of claim 9 wherein the front end further includes a linear portion which engages a first seat within the main test structure when engaged by the device to be tested; and
   wherein the tail end engages a second seat located proximally to the elastomeric material.

11. The method of claim 9 wherein the one or more probes being high frequency probes.

12. The method of claim 9 wherein the main test structure is made from polyimide film.

13. The method of claim 9 wherein the guide plate is made from a material selected from the group comprising: a polyether block amide (PEBA), a polyether ether ketone (PEEK), polyvinyl alcohol (PVA), Polytetrafluoroethylene (PTFE), fluorinated ethylene propylene (FEP), polyvinyl, polyimide, polyimide, polyethylene, or a combination thereof.

14. The method of claim 9 wherein the elastomeric material is rod shaped and comprised of a material selected from the group including a thermoplastic elastomer, a thermoplastic urethane, a natural rubber, a synthetic rubber, a silica gel, a polymer, a copolymer, a polyolefin, or a combination thereof.

15. The method of claim 9 wherein the elastomeric material is pre-compressed by the one or more probes and compressed further by the probe as the front end of the probe is engaged by the lead or terminal pad of the device to be tested and urged into the aperture.

16. The method of claim 9 further comprising a shoulder defined by said housing for engaging the probe and limiting the distance the probe extends beyond the upper surface of the main test structure.

* * * * *